United States Patent
Kato (10) Patent No.: US 11,198,287 B2
(45) Date of Patent: Dec. 14, 2021

(54) SCREEN PRINTING MACHINE (71) Applicant: FUJI CORPORATION, Chiryu (JP)

(72) Inventor: Mitsuaki Kato, Anjo (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/643,638

(22) PCT Filed: Sep. 7, 2017

(86) PCT No.: PCT/JP2017/032320
§ 371 (c)(1),
(2) Date: Mar. 2, 2020

(87) PCT Pub. No.: WO2019/049278
PCT Pub. Date: Mar. 14, 2019

(65) Prior Publication Data
US 2020/0207072 A1 Jul. 2, 2020

(51) Int. Cl.
*B41F 15/44* (2006.01)
*H05K 3/12* (2006.01)

(52) U.S. Cl.
CPC .......... *B41F 15/44* (2013.01); *H05K 3/1225* (2013.01); *H05K 2203/0139* (2013.01); *H05K 2203/163* (2013.01)

(58) Field of Classification Search
CPC .......... B41F 15/00; B41F 15/26; B41F 15/36; B41F 15/38; B41F 15/42; B41F 15/44;
(Continued)

(56) References Cited

U.S. PATENT DOCUMENTS 6,129,014 A * 10/2000 Tani .................. B41F 15/16
101/126
10,889,103 B2 * 1/2021 Kondo .................. B41F 15/26
(Continued)

FOREIGN PATENT DOCUMENTS

JP 2007-320207 A 12/2007
JP 2007320207 * 12/2007 .............. B41F 15/36
(Continued)

OTHER PUBLICATIONS

International Search Report dated Nov. 21, 2017 in PCT/JP2017/032320 filed on Sep. 7, 2017.

*Primary Examiner* — Matthew G Marini
*Assistant Examiner* — Marissa Ferguson-Samreth
(74) *Attorney, Agent, or Firm* — Oblon, McClelland, Maier & Neustadt, L.L.P.

(57) ABSTRACT

A screen printing machine for appropriately contact between a mask and a board, comprising: a mask-holding device configured to hold a mask; a board-positioning device configured to hold a board and to position the held board with respect to a mask held by the mask-holding device from below; a squeegee device configured to spread a cream solder with respect to the mask; a height-measuring device configured to measure the height of the mask and the board; a control device configured to control each device, and to calculate the thickness of a mask lower layer, integrally formed with the mask, based on the measurement values obtained from the height-measuring device; and an operation display device configured to input operation and to display calculation values from the control device, and the like.

8 Claims, 5 Drawing Sheets

(58) Field of Classification Search
CPC .... B41F 15/46; B41F 15/085; B41F 15/0813; B41F 15/0818; B41F 15/0881; H05K 3/1225; H05K 3/1216; H05K 3/1233; H05K 2203/0139; H05K 2203/163
See application file for complete search history.

(56) References Cited

U.S. PATENT DOCUMENTS

2012/0090483 A1* 4/2012 Willshere ............ H05K 3/1216
 101/123
2014/0307236 A1* 10/2014 Kobayashi ............ B41F 35/003
 355/30

FOREIGN PATENT DOCUMENTS

| JP | 2011189673 | * | 9/2011 | ............ B41F 15/36 |
| JP | 2013-82100 A | | 5/2013 | |
| JP | 2013116584 | * | 6/2013 | ............ B41F 15/36 |

* cited by examiner

SCREEN PRINTING MACHINE

TECHNICAL FIELD

The present application relates to a screen printing machine for appropriately contacting between a mask and a board.

BACKGROUND ART

In a screen printing machine, a board is placed under a mask having print-pattern perforations, and cream solder is spread on the mask. Cream solder is applied to the board through the print-pattern perforations in order to print a print pattern onto the board. If the degree of contact between the mask and the board at the time of printing is inappropriate, a printing defect such as blurring of the print pattern will occur. Although board separation control is performed such that the board is lowered from the mask at a predetermined speed after the print pattern perforations are filled with the cream solder, the inappropriate contact occurs because the board separation is not adapted to the degree of contact between the mask and the board.

In this regard, Patent Literature 1 discloses a screen printing machine that counteracts the printing defects caused by insufficient contact between the mask and the board. The screen printing machine is provided with four mask pressing units, each unit having a cylinder extending downward from a telescopic arm, installed in the mask holder at the four corners of the mask. When the board is brought close to the mask from below, the cylinder of each mask pressing unit moves to a predetermined position, and the mask is pressed against the board below by an extension operation. The stroke amount of the cylinder, that is, the pressing amount of the mask is stored in advance in the memory of a control device.

Patent Literature

Patent Literature 1: JP-A-2013-082100

BRIEF SUMMARY

Technical Problem

However, since manufacturing errors occur in the thickness of the mask or the board, it is not always possible to counteract the errors with uniform data and, at the same time, it is also difficult to obtain data relating to the dimensions of various masks and boards. Moreover, masks are regularly cleaned, thereby reducing the thickness of the mesh or adhesive supporting the masks. Such changes in the thickness of the mesh or the adhesive are not uniform, making it difficult to convert the changes to data and store the data beforehand.

Thus far, printing conditions relating to the degree of contact have been set by an operator. That is, a gap due to a mesh or the like is generated between the superposed mask and board, and the gap is instinctually measured by the operator touching by hand or visually inspecting the mask and the translation height of the board relative to the mask, that is, the amount by which the board is pushed upward is determined. Since the adjustment of the amount the board is pushed up is extremely small, it is difficult to obtain an appropriate degree of contact between the mask and the board and obtain a uniform result every time, in such a case where individual differences occur depending on the operator.

It is therefore an object of the present disclosure to provide a screen printing machine for appropriately contacting between a mask and a board is optimized.

Solution to Problem

A screen printing machine according to one aspect of the present disclosure has a mask-holding device configured to hold a mask; a board-positioning device configured to hold a board and to position the held board with respect to a mask held by the mask-holding device from below; a squeegee device configured to spread a cream solder with respect to the mask; a height-measuring device configured to measure the height of the mask and the board; a control device configured to control each device, and to calculate the thickness of a mask lower layer, integrally formed with the mask, based on the measurement values obtained from the height-measuring device; and an operation display device configured to input operation and to display, calculation values from the control device, and the like.

Advantageous Effects

With the above configuration, since the thickness of the mask lower layer is calculated based on the measurement value obtained from the height-measuring device and the value is displayed on the operation display device, the operator can determine the board translation height of the board at the time of printing from the numerical value, and even if the thickness of the mesh or the adhesive changes, it is possible to appropriately contact between the mask and the board at the time of printing.

DESCRIPTION OF EMBODIMENTS

Figure 1:
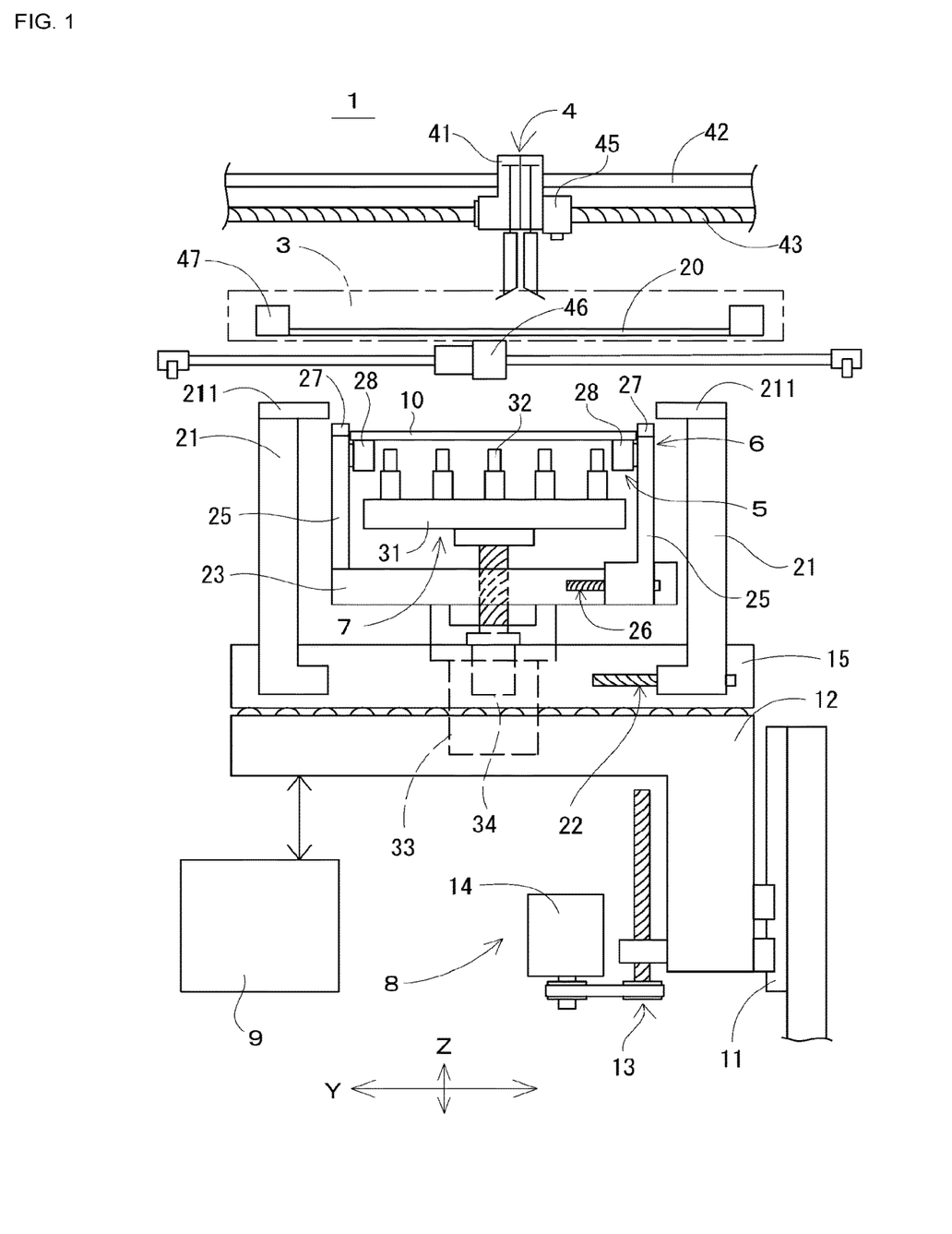
FIG. 1 A diagram showing, in a simplified manner, the internal structure of an embodiment of a screen printing machine.

Next, an embodiment of a screen printing machine of the present disclosure will be described below with reference to the drawings. FIG. 1 is a diagram showing the internal structure of the screen printing machine in a simplified manner, and shows a view from the width direction of the machine body, which is the conveyance direction of the board. Screen printing machine 1 prints cream solder on a board and constitutes a circuit board production line together with, for example, a solder inspection machine for inspecting a printing state, a component mounting machine for mounting electronic components on a board, and the like. Accordingly, the boards are sequentially conveyed to the respective machines constituting the circuit board production line, and in this screen printing machine 1, boards 10 are fed in the width direction of the machine, that is, the direction going into the drawing.

In screen printing machine 1, the entire internal structure shown in the drawing is covered with a machine body cover. Both side faces in the width direction of the machine body cover have conveyance ports which allow boards to be conveyed in and out. In the present embodiment, the longitudinal direction of screen printing machine 1 will be described as the Y-axis direction, the width direction of the machine body will be described as the X-axis direction, and the height direction of the machine body will be described as the Z-axis direction.

In screen printing machine 1, board 10 is conveyed under mask 20 placed in the machine, and cream solder passes through the print-pattern perforations from the upper face of mask 20 and is applied onto board 10 below to form a print pattern. Mask 20 is held, via a frame, by a pair of mask holders 3 arranged in the machine width direction on the inside upper portion of screen printing machine 1. Squeegee device 4 is installed above mask holder 3 and is mounted so as to be movable in the longitudinal direction of the machine body. Below mask holder 3, board conveyance device 5 for conveying in and out board 10 in the machine width direction, clamping device 6 for clamping board 10 in the front-rear direction of the machine body, backup device 7 for lifting and lowering board 10 to and from the clamping position, and the like are assembled to lifting and lowering device 8.

Lifting and lowering device 8 includes lifting and lowering table 12 sliding along vertical guide rail 11, and lifting and lowering table 12 is connected to lifting and lowering motor 14 via ball screw mechanism 13. Board conveyance device 5, clamping device 6, and the like are mounted on lifting and lowering table 12 via support table 15. A pair of mask supports 21 are provided on support table 15 in the longitudinal direction (Y-axis direction) of the machine body, and mask supporting plate 211, which comes in contact with mask 20, is fixed to the upper face of each leg. Ball screw mechanism 22 is formed in mask support 21 on the right side of the drawing, and the distance from mask support 21 on the left side of the drawing can be adjusted with mask support motor 24 (see FIG. 2).

Next, clamping device 6 has a pair of side frames 25, assembled on support table 23, in the longitudinal direction of the machine body orthogonal to the conveyance direction of board 10. Side frame 25 on the right side of the drawing has ball screw mechanism 26, and the distance from side frame 25 on the left side of the drawing can be adjusted with board clamp motor 29 (see FIG. 2). Clamp sections 27 are on the upper ends of the pair of side frames 25, and board 10 can be gripped by reducing the distance between clamp sections 27. Board conveyance device 5 including conveyor belt 28 is mounted on the inner side of side frame 25.

Backup device 7 for supporting board 10 is provided between the pair of side frames 25. Backup device 7 is configured such that backup table 31 having multiple backup pins 32 is supported via a ball screw mechanism and is lifted and lowered by backup motor 34. Support table 23 of clamping device 6 is supported via a ball screw mechanism and is configured to be moved up and down by lifting and lowering motor 33. Support table 15 supporting clamp device 6 and backup device 7 is configured so that the position of support table 15 relative to lifting and lowering table 12 in the X-direction, Y-direction, and θ-direction on the X-Y plane can be adjusted. That is, a correction device is configured to adjust the position of board 10, conveyed and held to the work position, relative to mask 20.

Squeegee device 4 is installed such that a pair of squeegees can move up and down with respect to traveling table 41. Traveling table 41 is slidably assembled to guide rod 42 and is linearly movable in the longitudinal direction of the machine body by being driven by squeegee motor 44 (see FIG. 2) via a ball screw mechanism constituted by screw shaft 43, which is parallel to guide rod 42. In the present embodiment, three laser displacement meters 45 are installed on traveling table 41. Since squeegee device 4 is elongated in the machine body width direction (i.e., the direction going into the drawing) in accordance with the width of mask 20, three laser displacement meters 45 are attached at intervals in the width direction of traveling table 41. Each laser displacement meter 45 measures the height of the upper face of board 10, mask 20, and the like, as will be described later.

Figure 2:
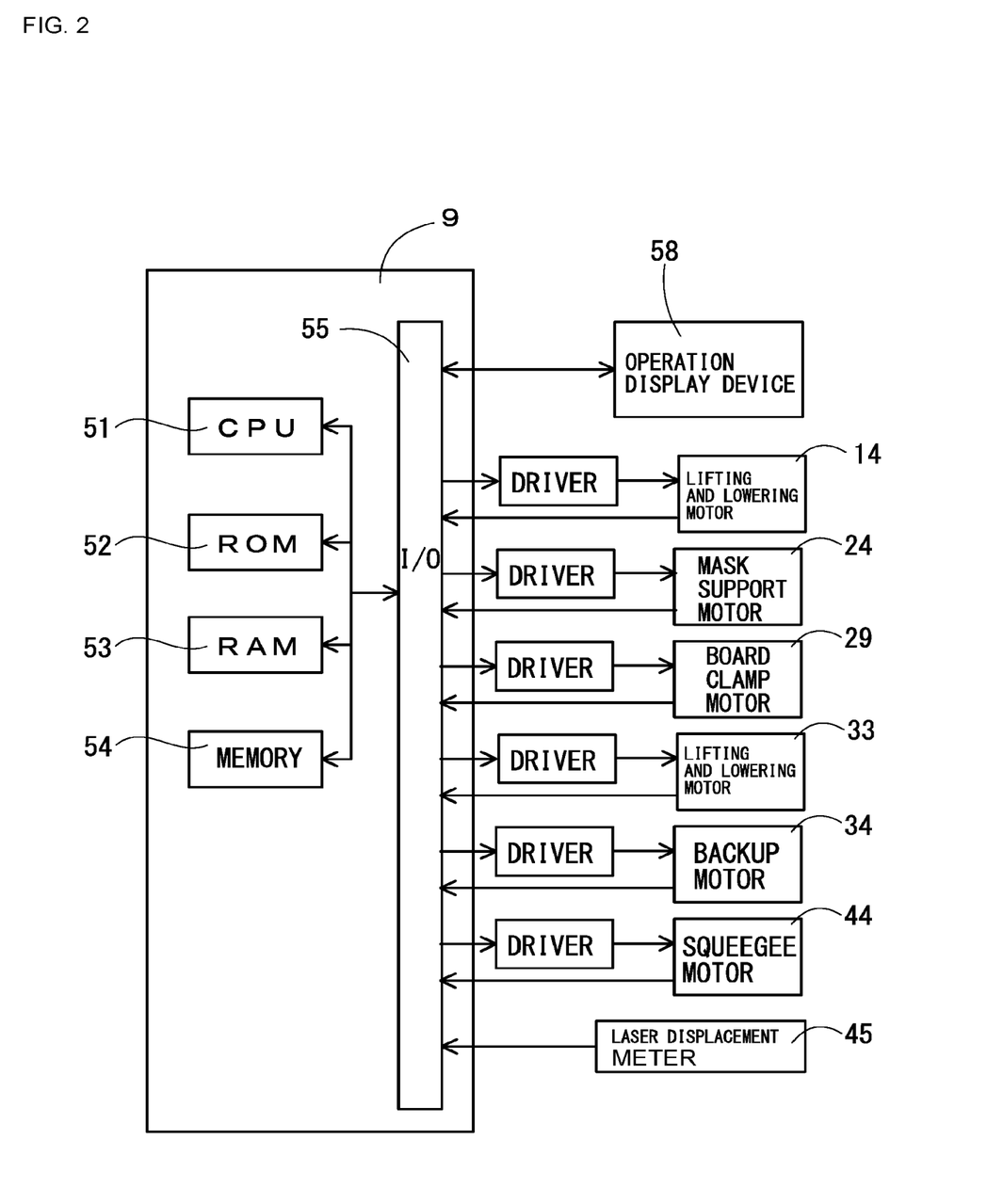
FIG. 2 A block diagram showing, in a simplified manner, a control system of the screen printing machine.

Control device 9 for controlling the driving of the entire machine is installed in screen printing machine 1 and controls the driving section of each of the devices. FIG. 2 is a block diagram showing, in a simplified manner, the control system of screen printing machine 1. Control device 9 includes microprocessor (CPU) 51, ROM 52, RAM 53, and nonvolatile memory 54, which are connected via bus lines. CPU 51 performs overall control of the entire control device, and ROM 52 stores system programs to be executed by CPU 51, control parameters, and the like, and RAM 53 stores temporary computation data, display data, and the like.

A touch-panel type operation display device 58 is attached to the front face of screen printing machine 1, and inputs data by an operator, and displays contents of work, numerical values, and the like. Operation display device 58 is connected to control device 9 via I/O port 55. Various other motors are connected to I/O port 55 via drivers. The various motors shown in the drawings are servomotors, and information (signals) on the rotation amounts of the motor itself can be transmitted from an encoder incorporated therein to control device 9. Further, laser displacement meters 45 are connected to I/O port 55, and measurement information thereof is transmitted to control device 9.

Nonvolatile memory 54 of control device 9 stores information required for processing performed by CPU 51, a printing control program of screen printing machine 1 described below is stored in nonvolatile memory 54 of control device 9, and the printing process is performed on board 10 by executing the printing control program. In the present embodiment, a measurement program for calculating a reference value for determining the amount by which board 10 is to be pushed up at the time of printing with respect to mask 20, an error calculation program for accurately calculating the reference value, and the like are also stored in nonvolatile memory 54.

Next, the operation of screen printing machine 1 will be described. In screen printing machine 1, board 10 is conveyed between side frames 25 by conveyor belt 28. Backup table 31 is then raised by being driven by backup motor 34, and board 10 is lifted from conveyor belt 28 by backup pins 32. Further, side frames 25 are moved by the driving of board clamp motor 29, and board 10 is sandwiched and held by the pair of clamp sections 27.

Next, clamping device 6 holding board 10 rises by being driven by lifting and lowering motor 33, and clamp sections 27 and board 10 become aligned with the height of mask supporting plate 211 such that the upper faces of each these devices align with each other. Between mask holder 3 and clamping device 6, camera 46 is provided which is movable in the XY plane. A mark affixed to board 10 is imaged by camera 46, the positional deviation amounts of the relative positions in the X, Y, and θ directions with respect to board 10 and mask 20 are calculated, and positional deviation corrections are performed by a correction device configured in support table 15.

Subsequently, lifting and lowering table 12 is raised by being driven by lifting and lowering motor 14, board 10 is pushed up to the board translation height, and board 10 is positioned with respect to mask 20. Mask 20 is then pressed against board 10 by squeegee device 4, and the rolled cream solder is pressed into the print-pattern perforations of mask 20. Thereafter, board separation for lowering board 10 at a predetermined speed is performed by driving by lifting and lowering motor 33, and the cream solder is printed on board 10 in accordance with the print pattern.

Figure 3:
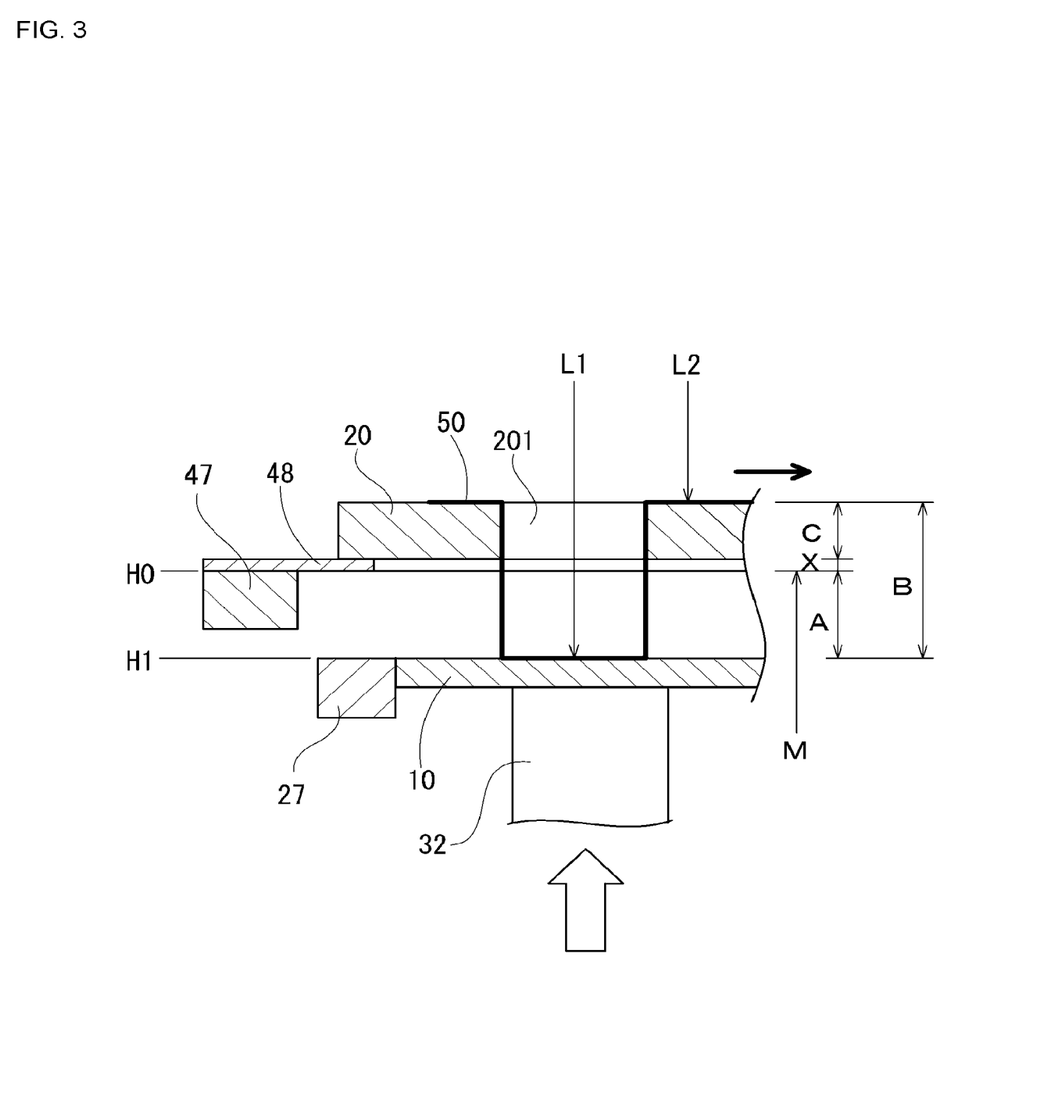
FIG. 3 An image diagram for calculating the thickness of a lower mask layer.

In screen printing machine 1, printing is performed on board 10 by driving each device as described above. One of the factors that deteriorate the printing quality is that the degree of contact between board 10 and mask 20 is not adapted to the board separation control. A change in the thickness of the mask lower layer, which includes mesh integrated with mask 20 or adhesive, could cause an inappropriate degree of contact. In other words, the mask lower layer creates a gap between mask 20 and board 10 at the time of printing, and the size of the gap becomes a reference value, so as to determine board translation height M shown in FIG. 3, which is the amount by which the board is to be pushed up. In this regard, in the present embodiment, the thickness of the mask lower layer is calculated by executing the measurement program stored in control device 9, so that the amount by which the board is to be pushed up can be reset based on the reference value. FIG. 3 is an image diagram for calculating the thickness of the mask lower layer.

In mask 20, mesh 48 made of polyester is stretched on square frame body 47, which is made of an aluminum alloy, so as to span over the frame, and the outer peripheral portion of the lower face of mesh 48 is adhered to the frame using an adhesive. Therefore, mask 20 is held inside frame body 47 so as to be pulled outward by mesh 48, which is under tension, and an extremely thin mask lower layer made of mesh 48 or adhesive is formed on the lower face. In the measurement program, the thickness of the mask lower layer made of mesh 48 or the like is calculated.

The calculation of the thickness of the mask lower layer is performed by turning on a start button of operation display device 58. First, as shown in FIG. 3, board 10 is positioned at measurement height H1 by being driven by lifting and lowering motors 14, 33 and backup motor 34, measurement height H1 being located below mask 20 and can be measured by laser displacement meters 45. In the case that the printing height (i.e., the theoretical height of the lower face of mask 20) at which board 10 contacts the lower layer of mask 20 is printing reference height H0, measurement height H1 is the height obtained by lowering board 10 by separation distance A from printing reference height H0. After positioning board 10, the heights of board 10 and mask 20 are measured by laser displacement meters 45.

In the height measurement, traveling table 41 of squeegee device 4 is driven, moving the three laser displacement meters 45 in the Y-axis direction (see FIG. 1), and laser beams are continuously irradiated on mask 20 in the direction indicated by the arrow. Then, board upper face distance L1, to the upper face of board 10 passing through print-pattern perforation 201, and mask upper face distance L2, to the upper face of mask 20 in the immediate vicinity, are acquired as a set of measurement data at multiple locations. In the present embodiment, a total of nine pieces of measurement data, measured at three points on scanning line 65 of each of the three laser displacement meters 45, are acquired.

Next, based on measured distances L1, L2, which are measured values, separation distance A, which is a set value, and thickness C (a design value) of mask 20, inputted from operation display device 58, thickness X of the mask lower layer, made of mesh 48 or the like, is calculated. That is, the upper face height of board 10 is calculated from board upper face distance L1, and the upper face height of mask 20 is calculated from mask upper face distance L2. Upper face distance B is calculated by taking the difference between the measured distance L1 to the upper face of board 10 and the measured distance L2 to the upper face of mask 20. Then, thickness X of mask lower layer is obtained from the calculation formula (i.e., upper face distance B−separation distance A−mask thickness C).

Specific numerical values are, for example, upper face distance B (210 μm)−separation distance A (100 μm)−mask thickness C (μm)=thickness X (10 μm) of the mask lower layer. The obtained value of thickness X of the mask lower layer is displayed on operation display device 58 as a reference value. Thickness X of the mask lower layer is the size of the gap between mask 20 and board 10 at the time of printing. Based on this reference value, the operator determines the amount by which board 10 is to be pushed up, that is, the drive control value of lifting and lowering motor 14 to lift board 10 (i.e., board translation height M) so as to appropriately contact between mask 20 and board 10 at the time of printing, and executes a resetting process.

Incidentally, since mask 20 is stretched by mesh 48, which is under tension, if mesh 48 is thinned by mask cleaning, a deflection forms in mask 20. Also, in the case of a double-sided mounting board, board 10 is warped by reflow. As a result, variations occur in measurement values obtained at multiple points. Therefore, in the measurement program of the present embodiment, multiple reference values are calculated so that the operator can determine the appropriate degree of contact in the event of a deflection of mask 20 or the like. That is, multiple reference values are displayed on operation display device 58 as thickness X of the mask lower layer of multiple patterns.

Therefore, first, as described above, for mask 20 and board 10, the board upper face distance L1 and the mask upper face distance L2 are measured at multiple positions with laser displacement meters 45 to obtain the upper face height at each position. From the multiple measured values, various measured values including the maximum value (L1max, L2max), the minimum value (L1min, L2min), and the mean value (L1ave, L2ave) are obtained for the board upper face distance L1 and the mask upper face distance L2. Then, thickness X of the mask lower layer is calculated from the above calculation formula by combining the various measurement values.

For example, mask lower layer thickness X is calculated by using the same kind of measurement values such as the maximum value, the minimum value, or the average value of the board upper face distance L1 and the mask upper surface distance L2, and by combining the different measurement values such as the maximum value (L1max) of the board upper face distance L1 and the average value (L2ave) of the mask upper face distance L2. Then, each calculated thickness X of the mask lower layer is displayed on operation display device 58. Accordingly, the value of the printing height is newly reset by an input operation, and at this time, the operator can determine the appropriate printing height in accordance with a value selected from mask lower layer thickness X of each pattern.

Figure 4:
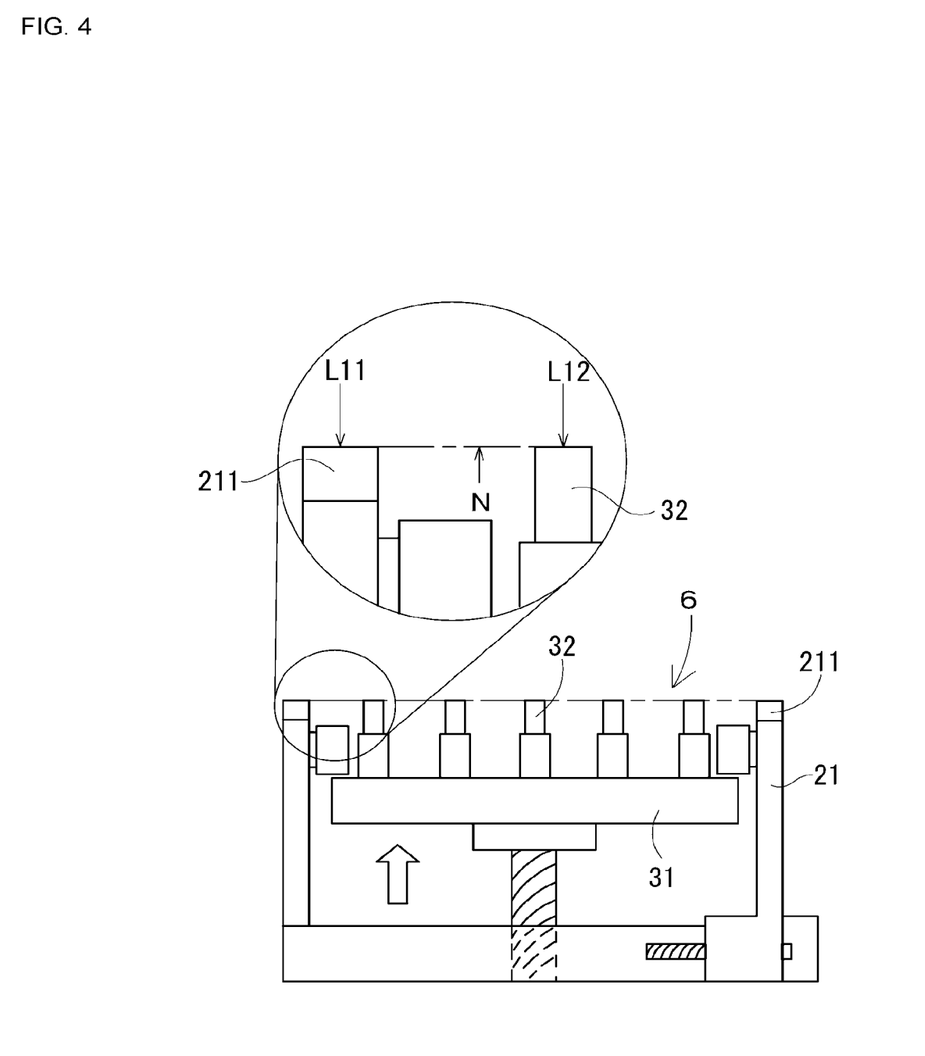
FIG. 4 A diagram showing a clamping device when a manufacturing error calculation process of a board is executed.
Figure 5:
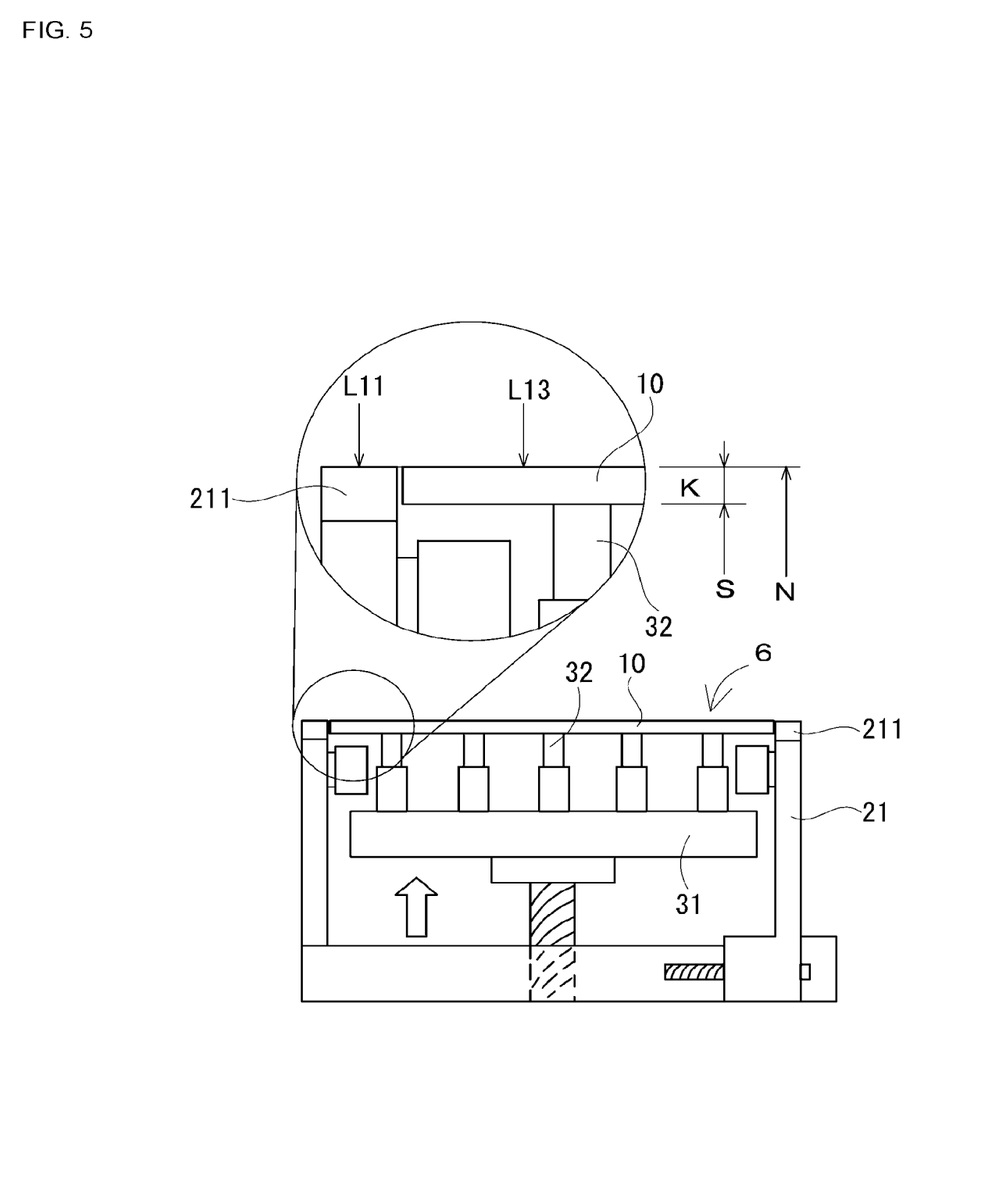
FIG. 5 A diagram showing the clamping device when the manufacturing error calculation process of the board is executed.

Subsequently, in order to obtain a correct value when calculating the thickness of the mask lower layer, the height of the upper face of board 10 at the time of measurement shown in FIG. 3 must coincide with measurement height H1. However, the height of the upper face of board 10 may deviate from H1 due to a manufacturing error in board 10. Therefore, it is necessary to perform a height adjustment process to absorb any manufacturing errors, and in the present embodiment, a manufacturing error of board 10 is calculated by executing the error calculation program stored in control device 9, and the control value is reset based on the calculated value. FIGS. 4 and 5 are diagrams showing clamping device 6 when a manufacturing error calculation process of the board is executed.

After mask 20 is removed from screen printing machine 1, the board manufacturing error calculation process is executed by turning on the start button of operation display device 58. First, clamping device 6 is raised until a position is reached at which the upper face of clamping device 6 can be measured with laser displacement meters 45, clamping device 6 being driven by lifting and lowering motors 14, 33 and backup motor 34. As shown in FIG. 4, backup motor 34 is driven and controlled so that the tip end faces of backup pins 32 coincide with the upper faces of clamp sections 27. In control device 9, data of reference translation height N for enacting the same condition is stored in the memory.

Therefore, laser displacement meters 45 measure clamp section upper face distance L11, to upper face of clamp section 27, and pin tip end face distance L12, to the tip end faces of backup pins 32, and obtains the upper face height and the tip end face height. The error is then calculated from the value obtained by subtracting pin tip end face distance L12 from clamp section upper face distance L11, and the lifting position of backup pins 32 is adjusted. That is, reference translation height N of board 10 is automatically corrected so that the difference in height between the tip end face of backup pins 32 and the upper face of clamp section 27 becomes zero, and the rotation angle outputted from backup motor 34 is adjusted.

Next, board 10 is transferred to clamping device 6 by board conveyance device 5, and board 10 lifted by backup pins 32 is clamped by clamping section 27, as shown in FIG. 5. Since design thickness value K of board 10 is inputted from operation display device 58, drive control of backup pins 32 is performed to lift board 10 to board holding translation height S, which is obtained by subtracting design thickness value K of board 10 from reference translation height N. Since the design thickness value of board 10 is constant for each lot, the manufacturing error calculation process of board 10 is, for example, performed when the lot of board 10 is changed.

Next, laser displacement meters 45 measure clamp section upper face distance L11, to the upper face of clamp section 27, and board upper face distance L13, to the upper face of board 10 clamped by clamp section 27, and obtains the respective upper face heights. The manufacturing error of board 10 is then calculated from the value obtained by subtracting board upper face distance L13 from clamp section upper face distance L11, and the value of the error (or the actual board thickness) is displayed as a numerical value for board 10 on operation display device 58. Thus, design thickness value K of board 10 is inputted again from operation display device 58 so that the height difference between the upper face of clamp section 27 and the upper face of board 10 is zero. As a result, board holding translation height S is corrected, the rotation angle outputted from backup motor 34 when holding board 10 is adjusted, and when calculating the thickness of the above-mentioned mask lower layer, the upper face height of board 10 coincides with measurement height H1 and a correct value is obtained.

Therefore, with the present embodiment, since thickness X of the mask lower layer is calculated and the value thereof is displayed on operation display device 58, the operator can determine board translation height M of board 10 at the time of printing from the numerical value, and even if the thickness of mesh 48 changes, it is possible to appropriately contact between mask 20 and board 10 at the time of printing. In particular, since thickness X of the mask lower layer is calculated by measurement using laser displacement meters 45, the change in the thickness of mesh 48 can be accurately obtained each time. It is then possible to attain an appropriate degree of contact between mask 20 and board 10 regardless of the experience of the operator or the like. In addition, since it is possible to accurately measure the manufacturing error of board 10, the determination of board translation height M of board 10 at the time of printing by the operator becomes highly reliable with respect to the degree of contact between mask 20 and board 10.

Although an embodiment of the present disclosure has been described above, the present disclosure is not limited thereto, and various modifications can be made without departing from the spirit thereof. For example, the deflection of mask 20 and the state of warpage of board 10 may be displayed from multiple measurement distances L1, L2. Further, in the above-described embodiment, a case has been described in which thickness X of the mask lower layer is displayed on operation display device 58 so that the operator sets board translation height M of board 10 at the time of printing as a reference value, but board translation height M may be automatically corrected based on the reference value, for example. In the above embodiment, a total of nine pieces of measurement data are acquired from the three laser displacement meters 45, but a total of 12 pieces of measurement data, for example, may be acquired with four or more measurement points.

REFERENCE SIGNS LIST

1 . . . Screen printing machine, 4 . . . Squeegee device, 5 . . . Board conveyance device, 6 . . . Clamping device, 7 . . . Backup device, 8 . . . Lifting and lowering device, 9 . . . Control device, 10 . . . Board, 14 . . . Lifting and lowering motor, 20 . . . Mask, 27 . . . Clamping section, 32 . . . Backup pin, 33 . . . Lifting and lowering motor, 34 . . . Backup motor, 45 . . . Laser displacement meter, 47 . . . Frame body, 48 . . . Mesh, 58 . . . Operation display device

The invention claimed is:

1. A screen printing machine, comprising:
a mask support configured to hold a mask;
a board-positioning device configured to hold a board and to position the board with respect to a mask held by the mask support from below, the board-positing device including a lifting and lowering table;
a squeegee device configured to spread a cream solder with respect to the mask;
a displacement meter configured to measure from above a height of the mask and a height of the board;
a control device configured to control each device, and to calculate a thickness of a mask lower layer, integrally formed with the mask, based on the measurement values obtained from the displacement meter; and a display configured to input operation and to display calculation values from the control device.

2. The screen printing machine of claim 1,
wherein the displacement meter measures a mask upper face height of a mask held by the mask support and a board upper face height of the board moved to a measurement height position by being driven by the board positioning device, and
the control device calculates the thickness of the mask lower layer based on values of the mask upper face height, the board upper face height, the mask thickness, and a separation distance from the board upper face at the measurement height to a reference height below the mask.

3. The screen printing machine of claim 2,
wherein the displacement meter measures the mask upper face height and the board upper face height at multiple locations,
the control device calculates the thickness of the mask lower layer based on each combination of the maximum value, the minimum value, and an average value relating to the mask upper face height and the board upper face height, and
the display displays multiple thicknesses of the mask lower layer calculated from each combination.

4. The screen printing machine of claim 2, wherein the control device calculates a mask upper face distance by subtracting the board upper face height and the mask upper face height and calculates the thickness of the mask lower layer by subtracting the separation distance and the mask thickness from the mask upper face distance.

5. The screen printing machine of claim 1,
wherein the displacement meter measures a board top face height held by the board positioning device based on a design thickness value of the board, and a reference top face height of the board-positioning device,
wherein the control device calculates an error between a design height value of the board based on a measurement value obtained from the displacement meter, and,
wherein the display displays a numerical value of the board based on the error.

6. The screen printing machine of claim 1, wherein the displacement meter includes a laser.

7. The screen printing machine of claim 1, wherein the displacement meter is attached to a traveling section of the squeegee device.

8. The screen printing machine of claim 1, wherein the mask lower layer is an elastic mesh attached to a frame on an outer periphery of the elastic mesh.

* * * * *